United States Patent
Pan et al.

(10) Patent No.: US 7,291,908 B2
(45) Date of Patent: Nov. 6, 2007

(54) QUAD FLAT NO-LEAD PACKAGE STRUCTURE AND MANUFACTURING METHOD THEREOF

(75) Inventors: Jui-Hsiang Pan, Hsnichu (TW); Kuang-Shin Lee, Hsinchu (TW); Cheng-Kuang Sun, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 10/710,933

(22) Filed: Aug. 13, 2004

(65) Prior Publication Data

US 2005/0073055 A1    Apr. 7, 2005

(30) Foreign Application Priority Data

Oct. 7, 2003  (TW) ............... 92127758 A

(51) Int. Cl.
  *H01L 23/485* (2006.01)
(52) U.S. Cl. .......... 257/690; 257/700; 257/784; 257/774; 257/E23.02
(58) Field of Classification Search ......... 257/700, 257/778, 784, 690, 685, E23.02, E23.031, 257/E23.034, 774
  See application file for complete search history.

(56) References Cited

U.S. PATENT DOCUMENTS 5,793,105 A * 8/1998 Pace ............... 257/700
5,959,846 A * 9/1999 Noguchi et al. ............ 361/782
6,261,467 B1 * 7/2001 Giri et al. .............. 216/13
6,303,978 B1 * 10/2001 Daniels et al. ............. 257/642
6,534,879 B2 * 3/2003 Terui ................ 257/786
6,911,736 B2 * 6/2005 Nagarajan ............... 257/737

FOREIGN PATENT DOCUMENTS

CN    1156903 A    8/1997

* cited by examiner

*Primary Examiner*—Evan Pert
*Assistant Examiner*—Victor A. Mandala, Jr.
(74) *Attorney, Agent, or Firm*—Jianq Chyun IP Office

(57) ABSTRACT

The present invention provides a QFN package structure, comprising a chip carrier and at least a chip. The chip is disposed on the top surface of the chip carrier, while the back surface of the chip carrier includes a plurality of flat no-lead conductive leads as I/O pads of the chip carrier for the external circuitry. A plurality of pads, corresponding to bonding pads of the chip, is disposed on the top surface of the chip carrier. The aforementioned package structure can employ wiring bonding technology, flip chip technology or surface mount technology to attach the chip to the chip carrier.

2 Claims, 6 Drawing Sheets

QUAD FLAT NO-LEAD PACKAGE STRUCTURE AND MANUFACTURING METHOD THEREOF

CROSS REFERENCE TO RELATED APPLICATIONS

This application claims the priority benefit of Taiwan application serial no. 92127758, filed Oct. 7, 2003.

BACKGROUND OF INVENTION

1. Field of Invention

The present invention relates to a package structure and the manufacturing method thereof. More particularly, the present invention relates to a quad flat no-lead (QFN) package structure and the manufacturing method thereof.

2. Description of Related Art

The semiconductor industries are highly developed high tech industries. With the trends of electrification, electronic and semiconductor devices are widely used in the daily life, including entertainment, education, transportation and households. The design of the electrical products becomes more complex, smaller-sized, light-weight and humanized, in order to offer more convenience for the consumers. In the package structures, the leadframe is one of the most commonly used elements, applied in various package products. Based on the type of leadframes, the quad flat packages (QFP) can be categorized as quad flat package with "I" lead (QFI), quad flat package with "J" lead (QFJ) and quad flat no-lead (QFN) package. Because leads of the leadframe in the QFN package end at the edges of the chip package structure, the QFN package has a small size and is also called quad flat no-lead (QFN) chip scale package. Since the QFN package provides shorter electrical path and faster signal communication rate, the QFN package has been widely used as low pin count solutions for power elements.

FIG. 1A is a cross-sectional view of a prior QFN package structure, while FIG. 1B is the top view of the prior QFN package structure in FIG. 1A.

Referring to FIGS. 1A and 1B, the QFN package structure 100 includes a chip 110, a die pad 120, a plurality of wires 130, a plurality of leads 140 and a mold compound 150. The chip 110 has an active surface 112 and an opposite back surface 114. A plurality of bonding pads 116 is disposed on the active surface 112, while the back surface 114 is fixed to an upper surface of the die pad 120 through a silver epoxy adhesive 118. Each bonding pad 116 is electrically connected to one of the leads 140 through the wire 160. The mold compound 150 covers the chip 110, the wires 130, the upper surface of the die pad 120 and upper surfaces of the leads 140, for protecting the chip 110 and the wires 130.

As shown in FIG. 1B, the bottom surface of the die pad 120 and the lower surfaces of the leads 140 are exposed from the bottom of the mold compound 150. The ends of leads 140 terminate at the edges of the mold compound 150 and the leads 140 arranged around the die pad 120 are used as I/O pads of the QFN package structure.

It is noted that the leads 140 and the die pad 120 used in the prior art are formed integrally with the leadframe. After cutting off the frame, the leads become separated and turn into individual I/O pads around the peripheral of the die pad. However, the number of the I/O pads is limited by the space occupied by the die pad, so that the I/O pad density can not be increased.

Moreover, in the molding process, a portion of the molding compound 150 may overflows to the bottom surface of the die pad 120 or the lower surfaces of the leads 140, causing the over-glue problem. Due to the difficulties in removing over-glue, the quality of the package structure 100 is usually declined.

SUMMARY OF INVENTION

The present invention provides a quad flat no-lead (QFN) package structure, which affords higher I/O pad density for the package structure.

The present invention provides a fabrication process for fabricating a quad flat no-lead (QFN) package, for improving the package quality of the package structure and solving the over-glue problems.

Accordingly, the present invention provides a QFN package structure, comprising a chip carrier and at least a chip. The chip is disposed on the top surface of the chip carrier, while the back surface of the chip carrier includes a plurality of flat no-lead conductive leads as I/O pads of the chip carrier for the external circuitry. A plurality of pads, corresponding to bonding pads of the chip, is disposed on the top surface of the chip carrier. The aforementioned package structure can employ wiring bonding technology, flip chip technology or surface mount technology to attach the chip to the chip carrier.

As embodied and broadly described herein, the present invention provides a manufacturing method for the QFN package structure, the method comprising the following steps: providing a substrate, forming a plurality of metal blocks on the substrate, forming an oxide layer covering the metal blocks and an interconnect layer on the oxide layer, wherein the interconnect layer includes a plurality of vias connecting to the metal blocks and a plurality of contact pads on a top surface of the interconnect layer, wherein the contact pads are electrically connected to the metal blocks through the vias, disposing at least a chip on the interconnect layer, wherein the chip includes a plurality of bonding pads corresponding to the contact pads; and removing the substrate to expose bottom surfaces of the metal blocks.

In this invention, the conductive leads (i.e. metal blocks) are arranged on the bottom surface of the chip carrier. Compared with the prior art, there are much more conductive leads in the chip carrier due to the arrangement of the conductive leads, thus fortifying the electrical properties of the package structure.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 2A:
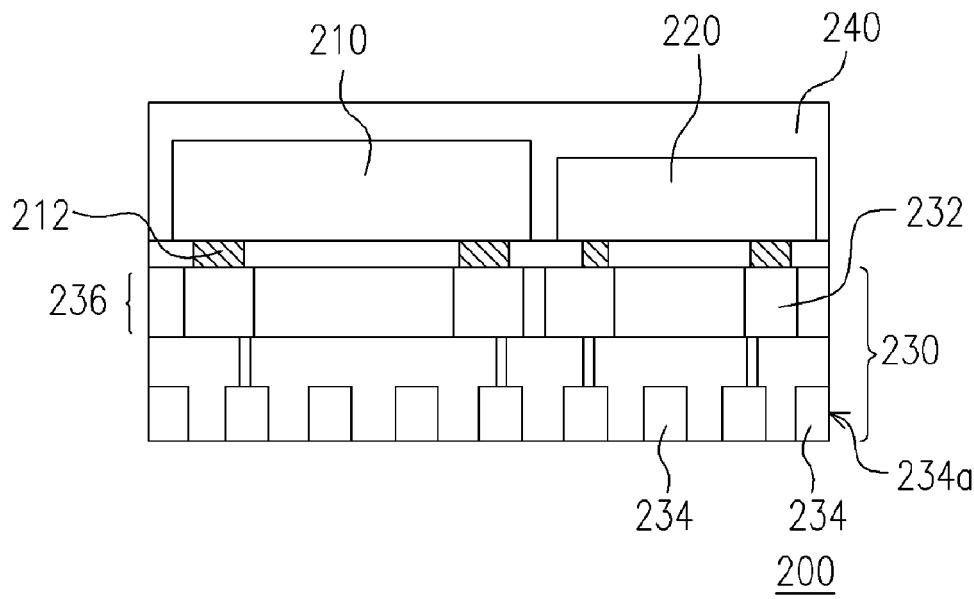
FIG. 2A is a display cross-sectional view showing a QFN package structure according one preferred embodiment of the present invention.
Figure 2B:
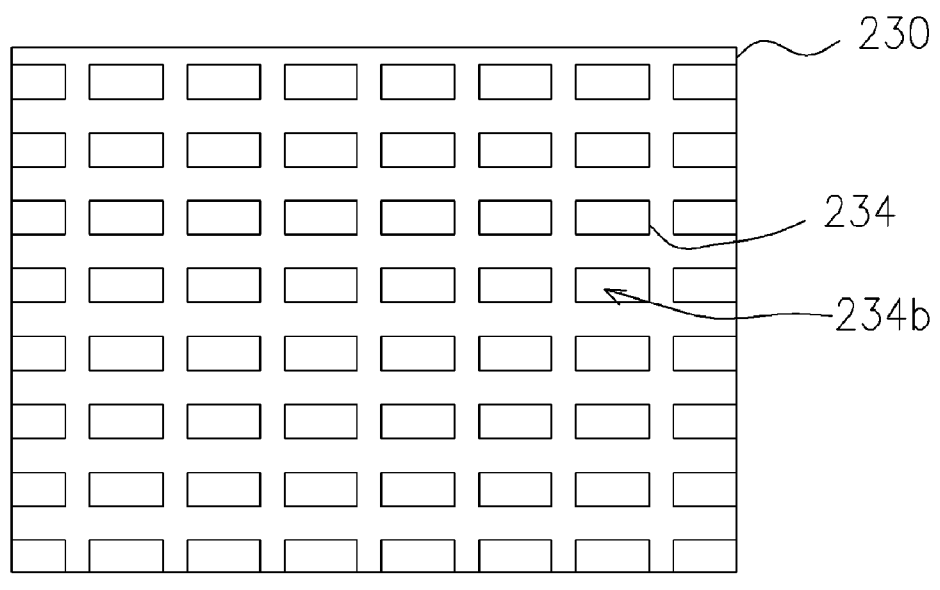
FIG. 2B is a display bottom view showing a QFN package structure according one preferred embodiment of the present invention.

Referring to FIGS. 2A & 2B, illustrating a cross-sectional view and a bottom view of a QFN package structure according one preferred embodiment of the present invention. The package structure 200 comprises a first chip 210, a second chip 220, a chip carrier 230 and a passivation layer 240. The first chip 210 and the second chip 220 are electrically connected to the chip carrier 230 by surface mount technology (SMT), or wire bonding or flip chip technology, for example, to form the multi-chip package IC module. Taking SMT as an example, the chips 210, 220 are electrically connected to contact pads 232 of the chip carrier 230 through anisotropic conductive paste (ACP) 212. If the flip chip technology is used, the first and second chips are electrically connected to the pads 232 of the chip carrier 230 through bumps (not shown) arranged in arrays. Similarly, if the wire-bonding technology is used, the backsides of the first and second chips are attached to the chip carrier 230 and the chips are electrically connected to the pads 232 of the chip carrier 230 through gold wires (not shown).

Figure 1A:
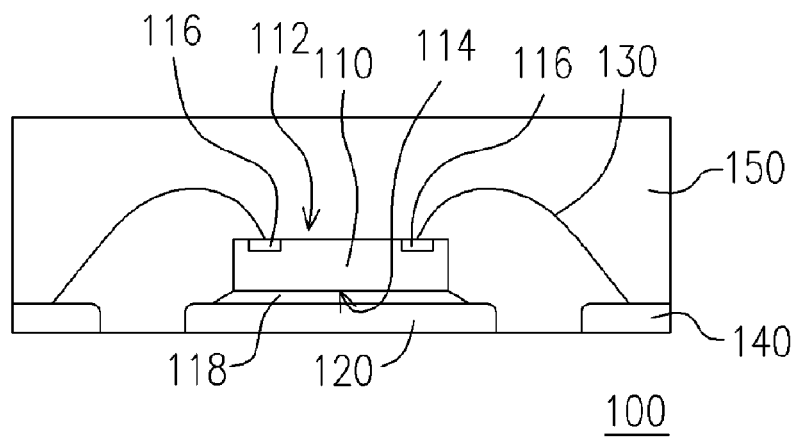
FIG. 1A is a cross-sectional view of a prior QFN package structure.
Figure 1B:
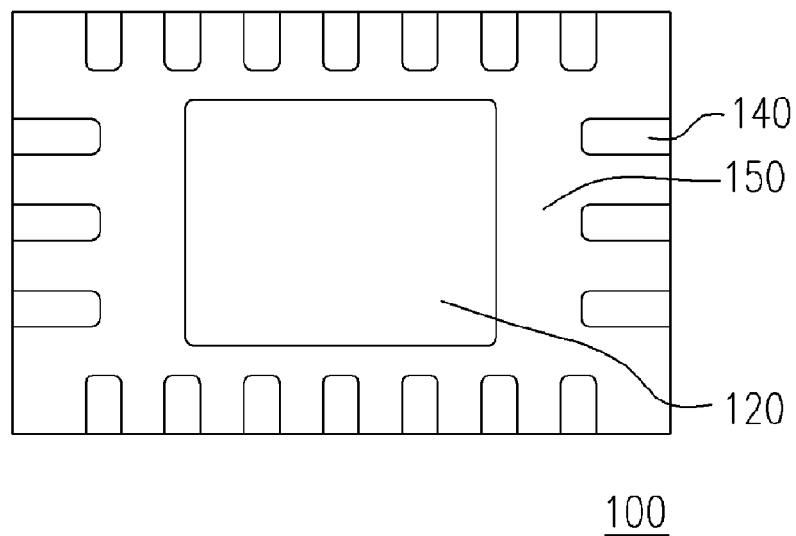
FIG. 1B is the top view of the prior QFN package structure in FIG. 1A.

The top surface of the chip carrier 230 includes a plurality of pads 232, while a bottom surface of the chip carrier 230 includes a plurality of conductive leads 234. The pads 232 and the conductive leads 234 are connected to each other through an interconnect layer 236. From FIG. 2B, lower surfaces 234b of the conductive leads 234 are exposed by the bottom surface of the chip carrier 230. These conductive leads 234 are arranged, for example, in area arrays (9×9 or 11×11 . . . etc). Compared with the prior art, there are much more conductive leads 234 in the chip carrier 230, because the conductive leads need not to be arranged around the die pad (as in FIG. 1B) or be connected to the chip through wire bonding. Therefore, the number of the conductive leads needs not to be limited by the area of the die or the die pad. In addition, the over-glue problem is avoided. The external ends 234a of the conductive leads 234 that are arranged near the border of the chip carrier 230 terminate at edges of the package structure 200 (as shown in FIG. 2A). The number or the arrangement of the conductive leads 234 can be adjusted depending on the number, the arrangement or the type of the chips. The conductive leads 234 are detached and each conductive lead 234 can be used as the I/O pads for the chips 210, 220, thus strengthening the electrical properties of the package structures.

Accordingly, the present invention provides a manufacturing method for the QFN package structure. FIGS. 3A-3F are cross-sectional views showing processes of the manufacturing method for a QFN package structure according one preferred embodiment of the present invention.

Figure 3A:
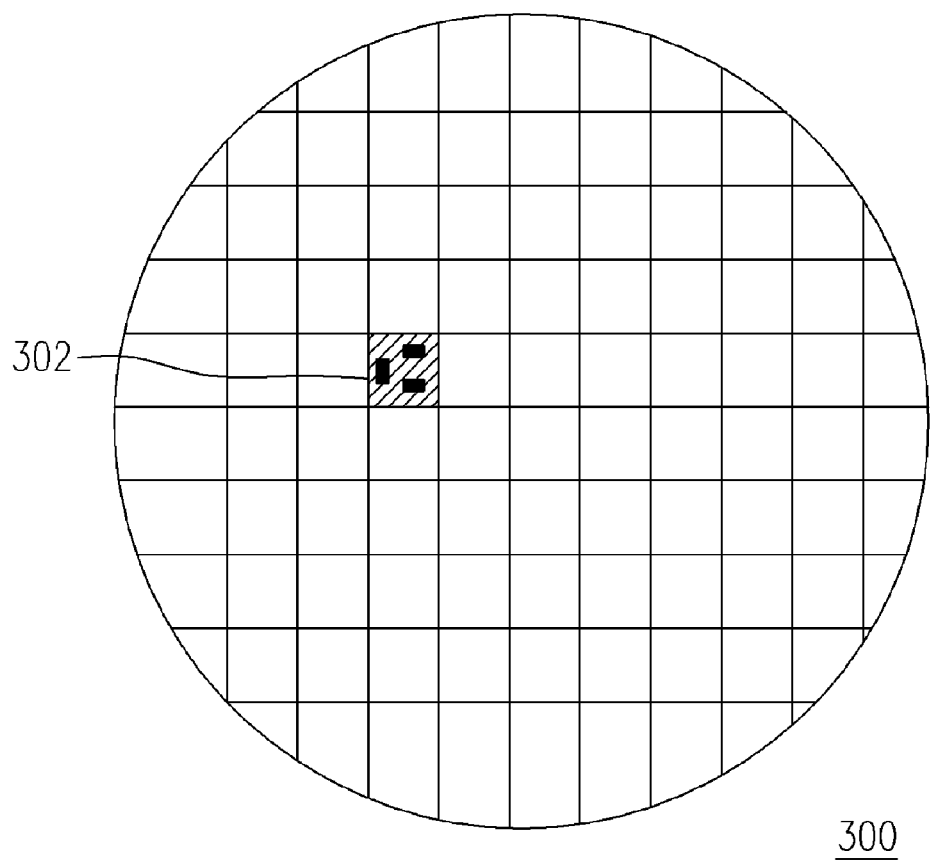
FIGS. 3A-3F are cross-sectional views showing processes of the manufacturing method for a QFN package structure according one preferred embodiment of the present invention.

First, referring to FIG. 3A, for the above package structure 200, if a wafer 300 is used as a substrate, the wafer 300 includes a plurality of sections 302, with each section 302 having the same integrated circuit therein, formed sequentially on the wafer 300 and completing the wiring layout. For example, the wafer 300 is either a substrate commonly used in the semiconductor fabrication processes, such as, a silicon substrate, a silicon-on-insulator (SOI) substrate or a glass substrate, or other materials with high hardness, such as, a metal plate or a polymer layer. In the cross-sectional view of FIG. 3B, a plurality of metal blocks 310 is formed on each section 302 of the substrate 300. The material of the metal blocks 310 can be any metal with excellent conductivity and thermal conductivity, such as, copper pr nickel-gold alloy, while these metal blocks 310 can be used as the conductive leads 234 in the above package structure 200.

Figure 3B:
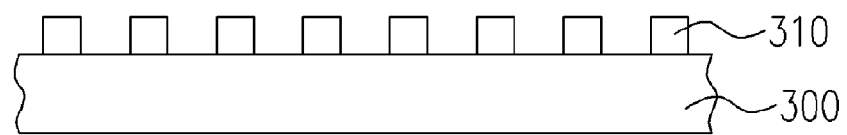
Figure 3C:
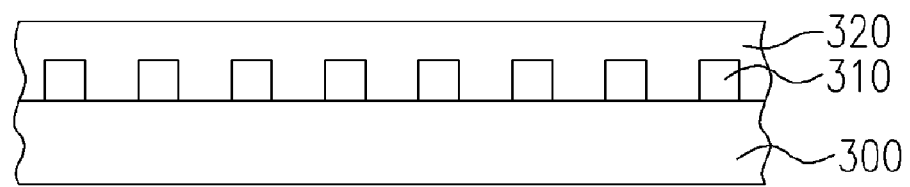

Referring to FIG. 3C, an oxide layer 320 is formed to cover the metal blocks 310. Preferably, the oxide layer 320 is a silicon oxide layer formed by physical vapor deposition (PVD), either evaporation or sputtering, to control the deposition rate and the thickness, for example. The oxide layer 320 can be planarized by, for example, CMP or plasma etching or etching back.

Figure 3D:
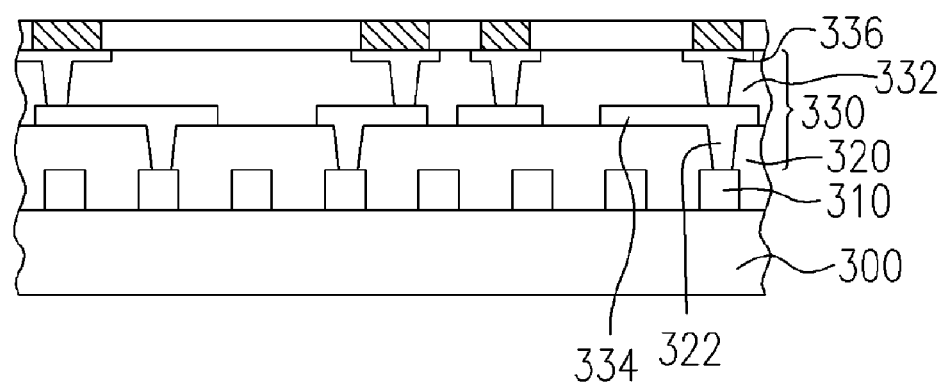

Referring to FIG. 3D, after forming a plurality of vias 322 in the oxide layer 320, an interconnect layer 330 is formed on the oxide layer 320. The interconnect layer 330 is connected to the metal blocks 310 through vias 322 within the oxide layer 320. The interconnect layer 330 includes a plurality of lines 334 on the oxide layer 320, a dielectric layer 332 on the oxide layer 320 and the lines 334, and a plurality of contact pads 336, formed through several photolithography steps. Alternatively, it is possible to consider that the interconnect layer further includes the oxide layer 320 and the vias 322.

The pads 336 are exposed by the top surface of the dielectric layer 332. The pad 336 is electrically connected with the via 322 though the line 334 in the interconnect layer 330, and is further electrically connected to the metal block 310, thus acting as a signal transmission pathway. Of course, it is possible that the interconnect layer includes more than one dielectric layers or more than one layers of lines. Especially, if more pads 336 are required for the chip, either the interconnect layer includes more layers, for example, 4 layers or 6 layers of dielectric layers and line layers, or the line-width of the lines is reduced to form pads 336 in high pitch arrays. Finally, the conductive leads 310 and the interconnect layer 330 can be formed sequentially on the surface of the wafer 300, as the circuit layout for the system. And the circuit testing can be performed.

Figure 3E:
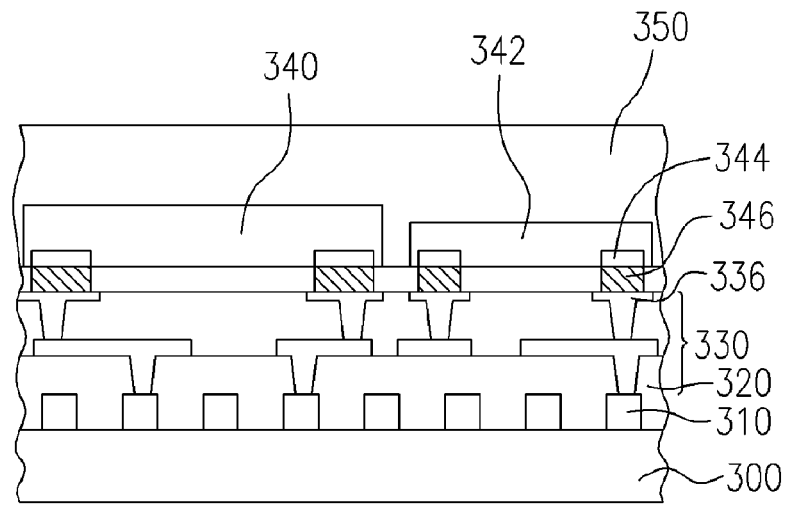

Referring to FIG. 3E, the first chip 340 and the second chip 342 are disposed on the interconnect layer 330 in each section 302 of the substrate 300 by surface mount technology (SMT), or wire bonding or flip chip technology, for example. Taking SMT as an example, in FIG. 3E, the bonding pads 344 of the chips 340, 342 are attached to contact pads 336 of the interconnect layer 330 through anisotropic conductive paste (ACP) 346, thus forming a multi-chip package structure. A planar passivation layer 350 is formed to cover the first and second chips 340, 342 by, for example, physical vapor deposition in a low-temperature magnetron sputter.

Figure 3F:
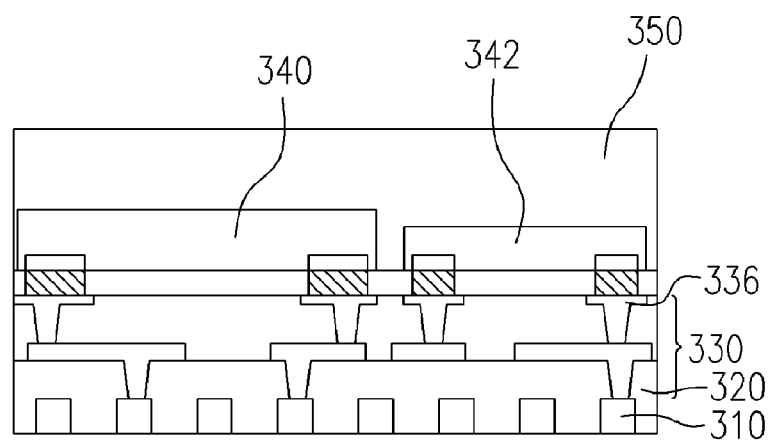

Referring to FIG. 3F, the substrate 300 is separated from the above multi-chip package structure 302. After the substrate 300 is removed, the bottom of the metal blocks 310 are exposed, so that the metal blocks 310 act as I/O pads of the multi-chip package structure 302. In fact, these metal blocks 310 are the conductive leads 234 in the chip carrier 230 of FIG. 2A-2B. In this embodiment, the substrate 300 can be reused so as to reduce the production costs. However, if the substrate 300 is not to be reused, the substrate 300 can be diced together with the multi-chip package structure 302, and then removed.

Figure 4A:
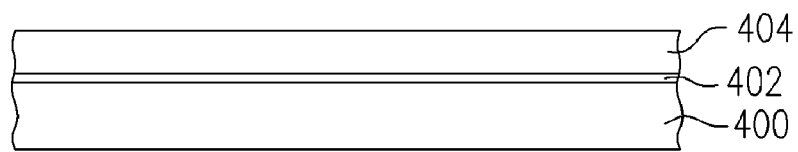
FIGS. 4A-4D are cross-sectional views showing manufacturing processes for the metal blocks according one preferred embodiment of the present invention.
Figure 4B:
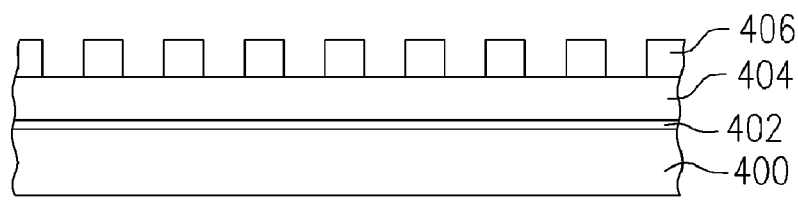
Figure 4C:
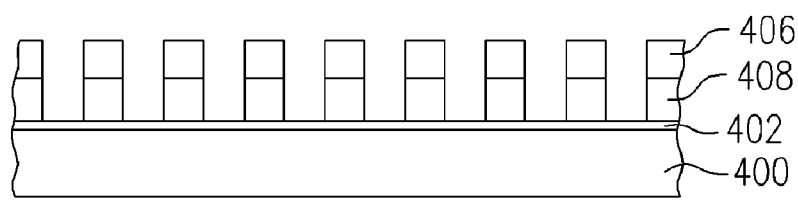
Figure 4D:
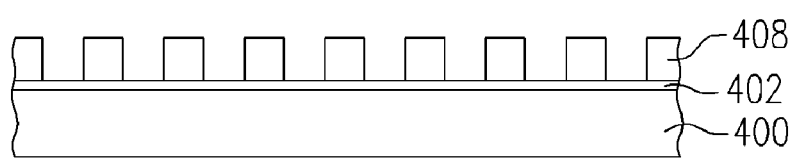

The metal blocks 310 shown in FIG. 3B can be obtained through different fabrication processes. As shown in FIGS. 4A-4D, the manufacturing processes for the metal blocks according one preferred embodiment of the present invention are illustrated. In FIG. 4A, a metal layer 404 is formed over the substrate 400 by either affixture or plating. An etching stop layer 402, for example, a chromium layer, can be further included between the substrate 400 and the metal layer 404, if necessary. A patterned photoresist layer 406 is formed on the metal layer 404, as shown in FIG. 4B. Referring to FIG. 4C, using the patterned photoresist layer 406 as a mask, the metal layer 404 that is not covered by the photoresist layer 406 is etched until the etching stop layer 402 is exposed, so as to define the metal blocks 408. Referring to FIG. 4D, the patterned photoresist layer 406 is removed. Preferably, the metal blocks 408 are obtained through anisotropically etching the metal layer 404, and the metal blocks 408 have substantially vertical sidewall profiles. The width of the metal blocks 408 and the distance between the metal blocks 408 can be adjusted by etch settings.

If the etching stop layer 402 is included between the metal layer 404 and the substrate 400, the etching stop layer 402 will be removed together with the substrate 400.

It is noted that the prior system in package (SIP) for power devices utilizes the printed circuit board (PCB) and the lead frame to complete the SIP, which has high costs and low yields. However, in this invention, the wafer 300 is used as the substrate and the wiring layout is completed on the wafer 300, so that the conductive metal blocks 310 and the interconnect layer 330 can be formed sequentially on the surface of the wafer 300 as the circuit layout for the system. In addition, after completing the wiring layout, the circuit in each section 302 of the wafer 300 can be tested to eliminate or repair the faulty circuit, thus increasing the yield of the wafer 300. Afterwards, a plurality of chips 340, 342 with different functions are disposed on the uppermost circuit, and silicon dioxide 350 is deposited by low temperature DC sputter, as the passivation layer and the encapsulating material to complete the system in package. Since a plurality of system-in-package structures are formed at the same time from the wafer 300, the package cost is lowered. Further this technology can be combined with wafer level package technology to achieve multiple chip package, thus improving the yield of the chips.

In conclusion, the present invention a quad flat no-lead (QFN) package structure and a fabrication process thereof, for improving the package quality of the package structure and solving the over-glue problems. Moreover, the number of the conductive leads in this QFN package structure needs not to be limited by the area of the die or the die pad, thus increasing the density of the I/O pads and strengthening the electrical properties of the package structures.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

The invention claimed is:

1. A wafer-level package structure, comprising:
 a silicon wafer substrate, having a plurality of identical sections, each section comprising:
  a plurality of conductive blocks, disposed on the silicon wafer substrate;
  a dielectric layer covering the plurality of conductive blocks;
  a metal interconnect layer disposed on the dielectric layer, the metal interconnect layer comprising a plurality of pads disposed on an uppermost surface thereof, wherein the conductive blocks, the metal interconnect layer, and the pads are electrically connected by a plurality of vias; and
  at least a chip, disposed on the metal interconnect layer, wherein the chip includes a plurality of bonding pads that are correspondingly connected to the pads.

2. The wafer-level package structure of claim 1, further comprising a passivation layer covering each section of the silicon wafer substrate.

* * * * *